(12) United States Patent
Nishiyama

(10) Patent No.: US 8,699,278 B2
(45) Date of Patent: Apr. 15, 2014

(54) SEMICONDUCTOR INTEGRATED CIRCUIT

(75) Inventor: Takahide Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 13/234,373

(22) Filed: Sep. 16, 2011

(65) Prior Publication Data

US 2012/0195132 A1 Aug. 2, 2012

(30) Foreign Application Priority Data

Jan. 28, 2011 (JP) ................. 2011-016261

(51) Int. Cl.
*G11C 7/10* (2006.01)
*G11C 7/06* (2006.01)

(52) U.S. Cl.
USPC ................ 365/189.05; 365/189.07

(58) Field of Classification Search
USPC .......... 365/189.05, 189.16, 189.07, 200, 236, 365/189.12; 711/109, 118
See application file for complete search history.

(56) References Cited

U.S. PATENT DOCUMENTS

| 5,940,377 A * | 8/1999 | Sakaue et al. ................. 370/253 |
| 2008/0181018 A1 | 7/2008 | Nagadomi et al. | |
| 2010/0107021 A1 * | 4/2010 | Nagadomi et al. ............ 714/704 |
| 2011/0066900 A1 * | 3/2011 | Tokiwa ......................... 714/704 |
| 2012/0072806 A1 * | 3/2012 | Tabata et al. .................. 714/773 |

FOREIGN PATENT DOCUMENTS

JP 2008-181380 8/2008

* cited by examiner

*Primary Examiner* — Tuan T Nguyen
*Assistant Examiner* — Khamdan Alrobaie
(74) *Attorney, Agent, or Firm* — Oblon, Spivak, McClelland, Maier & Neustadt, L.L.P.

(57) ABSTRACT

According to one embodiment, a semiconductor integrated circuit includes an input register which latches, by a second unit, data which are read from a memory cell array by a first unit, a bit state-counter which counts a bit state of the data latched in the input register, a frame size-setup register which latches the first unit, an input data-counter which detects whether or not a total number of the data input to the input register reaches to the first unit, an accumulation circuit which accumulate a value counted by the bit state-counter, a threshold value-register which latches a threshold value for detecting whether or not an erase area of the memory cell array is accessed, a comparison circuit which compares an accumulated value of the accumulation circuit and the threshold value with each other, and a product storage-register which latches a result of the comparison circuit.

20 Claims, 9 Drawing Sheets

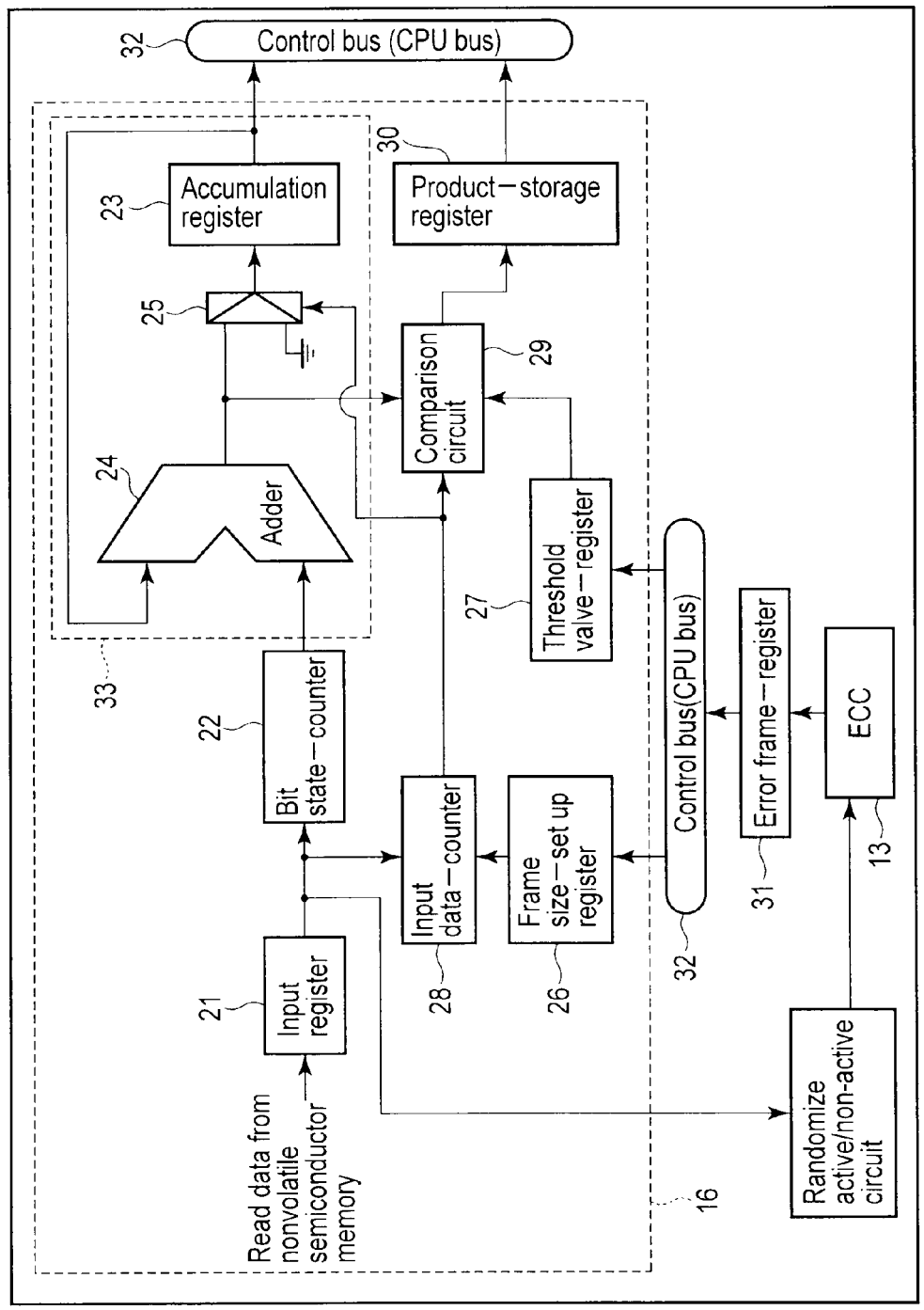
F I G. 4

| | bit 31 | bit 30 | bit 29 | bit 28 | bit 27 | bit 26 | bit 25 | bit 24 |
|---|---|---|---|---|---|---|---|---|
| Bit symbol | ERCNTEN | | | | | | | |
| Read/Write | R/W | | | | | | | |
| Reset | 0 | | | | | | | |

| | bit 23 | bit 22 | bit 21 | bit 20 | bit 19 | bit 18 | bit 17 | bit 16 |
|---|---|---|---|---|---|---|---|---|
| Bit symbol | | | | | | | | |
| Read/Write | | | | | | | | |
| Reset | | | | | | | | |

| | bit 15 | bit 14 | bit 13 | bit 12 | bit 11 | bit 10 | bit 9 | bit 8 |
|---|---|---|---|---|---|---|---|---|
| Bit symbol | | | | | | ERRTHOV[10:8] | | |
| Read/Write | | | | | | R/W | | |
| Reset | | | | | | 0 | 0 | 0 |

| | bit 7 | bit 6 | bit 5 | bit 4 | bit 3 | bit 2 | bit 1 | bit 0 |
|---|---|---|---|---|---|---|---|---|
| Bit symbol | ERTHOV[7:0] | | | | | | | |
| Read/Write | R/W | | | | | | | |
| Reset | 0 | 0 | 0 | 0 | 0 | 0 | 0 | 0 |

Threshold value-register

F I G. 6

| | bit 31 | bit 30 | bit 29 | bit 28 | bit 27 | bit 26 | bit 25 | bit 24 |
|---|---|---|---|---|---|---|---|---|
| Bit symbol | ERF31 | ERF30 | ERF29 | ERF28 | ERF27 | ERF26 | ERF25 | ERF24 |
| Read/Write | R/W | R/W | R/W | R/W | R/W | R/W | R/W | R/W |
| Reset | 0 | 0 | 0 | 0 | 0 | 0 | 0 | 0 |

| | bit 23 | bit 22 | bit 21 | bit 20 | bit 19 | bit 18 | bit 17 | bit 16 |
|---|---|---|---|---|---|---|---|---|
| Bit symbol | ERF23 | ERF22 | ERF21 | ERF20 | ERF19 | FRF18 | ERF17 | ERF16 |
| Read/Write | R/W | R/W | R/W | R/W | R/W | R/W | R/W | R/W |
| Reset | 0 | 0 | 0 | 0 | 0 | 0 | 0 | 0 |

| | bit 15 | bit 14 | bit 13 | bit 12 | bit 11 | bit 10 | bit 9 | bit 8 |
|---|---|---|---|---|---|---|---|---|
| Bit symbol | ERF15 | ERF14 | ERF13 | ERF12 | ERF11 | FRF10 | ERF9 | ERF8 |
| Read/Write | R/W | R/W | R/W | R/W | R/W | R/W | R/W | R/W |
| Reset | 0 | 0 | 0 | 0 | 0 | 0 | 0 | 0 |

| | bit 7 | bit 6 | bit 5 | bit 4 | bit 3 | bit 2 | bit 1 | bit 0 |
|---|---|---|---|---|---|---|---|---|
| Bit symbol | ERF7 | ERF6 | ERF5 | ERF4 | ERF3 | FRF2 | ERF1 | ERF0 |
| Read/Write | R/W | R/W | R/W | R/W | R/W | R/W | R/W | R/W |
| Reset | 0 | 0 | 0 | 0 | 0 | 0 | 0 | 0 |

Product-storage register (No.1)

F I G. 8

| Bit symbol | bit 31 | bit 30 | bit 29 | bit 28 | bit 27 | bit 26 | bit 25 | bit 24 |
|---|---|---|---|---|---|---|---|---|
| | ERF63 | ERF62 | ERF61 | ERF60 | ERF59 | FRF58 | ERF57 | ERF56 |
| Read/Write | R/W | R/W | R/W | R/W | R/W | R/W | R/W | R/W |
| Reset | 0 | 0 | 0 | 0 | 0 | 0 | 0 | 0 |

| Bit symbol | bit 23 | bit 22 | bit 21 | bit 20 | bit 19 | bit 18 | bit 17 | bit 16 |
|---|---|---|---|---|---|---|---|---|
| | ERF55 | ERF54 | ERF53 | ERF52 | ERF51 | FRF50 | ERF49 | ERF48 |
| Read/Write | R/W | R/W | R/W | R/W | R/W | R/W | R/W | R/W |
| Reset | 0 | 0 | 0 | 0 | 0 | 0 | 0 | 0 |

| Bit symbol | bit 15 | bit 14 | bit 13 | bit 12 | bit 11 | bit 10 | bit 9 | bit 8 |
|---|---|---|---|---|---|---|---|---|
| | ERF47 | ERF46 | ERF45 | ERF44 | ERF43 | FRF42 | ERF41 | ERF40 |
| Read/Write | R/W | R/W | R/W | R/W | R/W | R/W | R/W | R/W |
| Reset | 0 | 0 | 0 | 0 | 0 | 0 | 0 | 0 |

| Bit symbol | bit 7 | bit 6 | bit 5 | bit 4 | bit 3 | bit 2 | bit 1 | bit 0 |
|---|---|---|---|---|---|---|---|---|
| | ERF39 | ERF38 | ERF37 | ERF36 | ERF35 | FRF34 | ERF33 | ERF32 |
| Read/Write | R/W | R/W | R/W | R/W | R/W | R/W | R/W | R/W |
| Reset | 0 | 0 | 0 | 0 | 0 | 0 | 0 | 0 |

Product-storage register (No.2)

F I G. 9

SEMICONDUCTOR INTEGRATED CIRCUIT

CROSS-REFERENCE TO RELATED APPLICATIONS

This application is based upon and claims the benefit of priority from prior Japanese Patent Application No. 2011-016261, filed Jan. 28, 2011, the entire contents of which are incorporated herein by reference.

FIELD

Embodiments described herein relate generally to a semiconductor integrated circuit.

BACKGROUND

In order to prevent read disturb which is caused by repetition of read operations in a nonvolatile semiconductor memory such as a NAND flash memory, it is desirable to configure a system in which the number of read operations is reduced as much as possible. However, in the conventional systems, a processing of detecting whether or not an erase area is accessed when a read error occurs is executeed. In the processing, since a retry operation is executeed, occurrence of read disturb is encouraged, and latency is deteriorated.

BRIEF DESCRIPTION OF THE DRAWINGS

FIG. 4 is a diagram showing an erase area detecting-circuit;
FIG. 6 is a diagram showing a threshold value-register;
FIGS. 8 and 9 is diagrams, each showing a product storage-register.

DETAILED DESCRIPTION

In general, according to one embodiment, a semiconductor integrated circuit comprising: an input register which latches, by a second unit, data which are read from a memory cell array by a first unit; a bit state-counter which counts a bit state of the data latched in the input register; a frame size-setup register which latches the first unit; an input data-counter which detects whether or not a total number of the data input to the input register reaches to the first unit; an accumulation circuit which accumulate a value counted by the bit state-counter; a threshold value-register which latches a threshold value for detecting whether or not an erase area of the memory cell array is accessed; a comparison circuit which compares an accumulated value of the accumulation circuit and the threshold value with each other and detects whether or not the erase area is accessed; and a product storage-register which latches a result of the comparison circuit.

Hereinafter, one embodiment will be described with reference to the accompanying drawings.

To start with, a memory system as a premise will be described.

Figure 1:
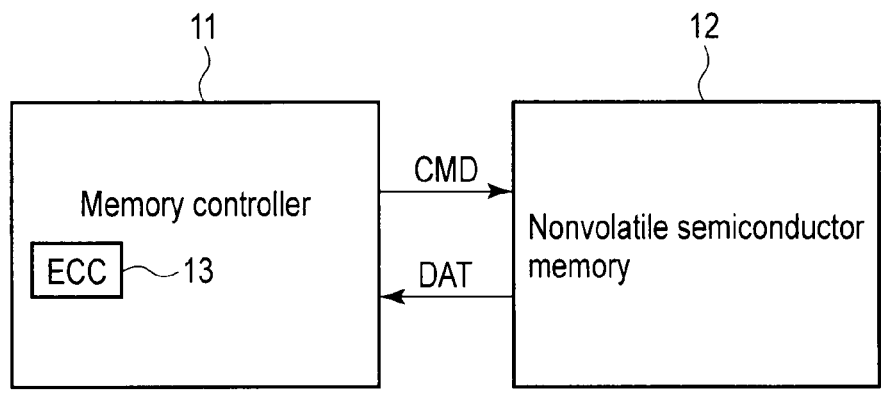
FIG. 1 is a diagram showing a memory system.

FIG. 1 shows a memory system.

Memory controller 11 controls a read operation of nonvolatile semiconductor memory 12. Memory controller 11 gives a command for a read operation to nonvolatile semiconductor memory 12 via a command signal CMD, and data DAT are read from nonvolatile semiconductor memory 12. Memory controller 11 has ECC (error correct circuit) 13.

Hereinafter, a processing executeed by the memory system when a read error occurs will be described.

Figure 2:
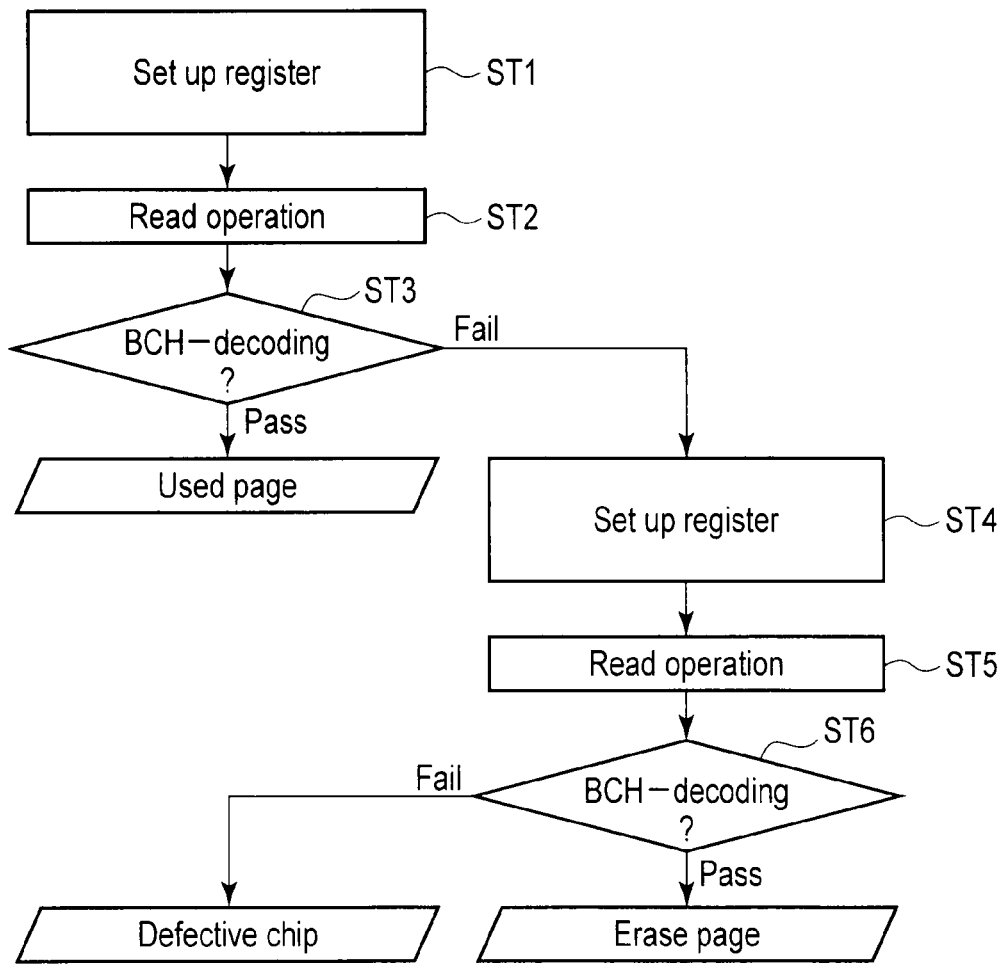
FIG. 2 is a flowchart showing an interruption processing when a read error occurs.

FIG. 2 shows a flowchart of the read operation.

The read operation is executed after predetermined register settings which are required for the data read from the nonvolatile semiconductor memory are input (Steps ST1 to ST2).

In an error correction by the ECC (e.g. BCH-decoding), when the error correction is allowed to pass, a page which is a read object is detected as a used page. On the other hand, when the error correction by the ECC fails (when a read error occurs), a processing for detecting whether or not the page which is the read object is the erase page is executeed (Step ST3).

In this processing, a retry operation to the page in which the read error occurred is executeed. The retry operation is executed after predetermined register settings which are required for the data read from the nonvolatile semiconductor memory are input, too (Steps ST4 to ST5).

Contents of the data read by the retry operation are confirmed by the ECC, and then it is detected whether or not the read object page is the erase page or not. The page is detected to be the erase page when a bit state of the read data is an erase level or to be a true read error, i.e. defective chip, when the bit state is not the erase level, whereby the processing proceeds to the next step (Step ST6).

A problem detected with the above-described read operation is the retry operation which is executeed for the purpose of detecting whether or not the erase area is accessed or not when the read error occurred. The retry operation lowers reliability by encouraging occurrence of read disturb and deteriorates access executeance by deteriorating latency.

As is apparent from the above description, in order to realize reliability improvement by suppressing read disturb and to realize access executeance improvement by improving latency as a result of reducing the number of reading operations in the processing to be executeed when a read error occurs, it is necessary to provide a function which enables to detect whether or not the erase area is accessed in the first read operation.

Figure 3:
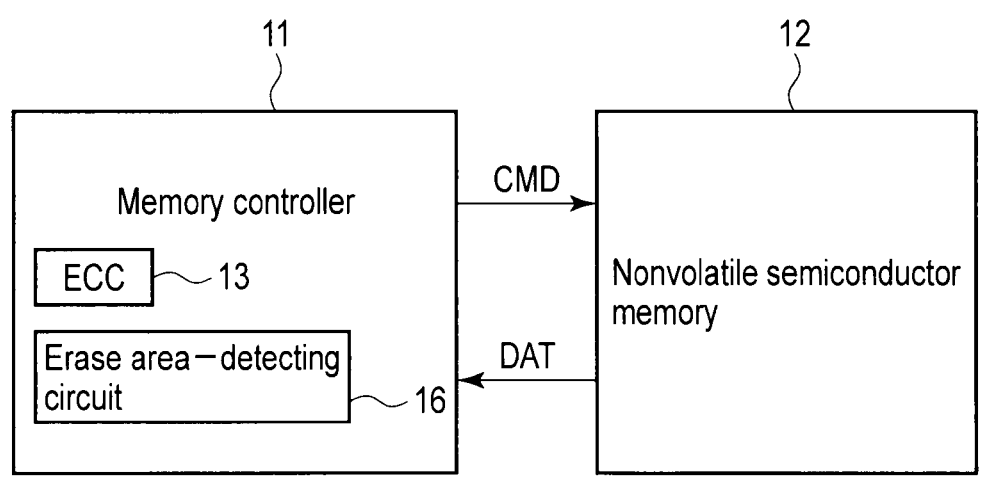
FIG. 3 is a diagram showing a memory system.

FIG. 3 is a memory system according to the embodiment.

The memory system is characterized by including erase area detecting-circuit 16 which is capable of detecting whether or not data read from nonvolatile semiconductor memory 12 exists in an erase area by one read operation. Erase area detecting-circuit 16 recognizes a bit state of the data read from nonvolatile semiconductor memory 12 by a frame size unit which is an error correction unit in the ECC and has a function of enabling to shift to a read error processing without executeing a retry operation when a read error occurs. With such configuration, the reliability improvement through read disturb suppression and the access executeance improvement through latency improvement are realized.

ECC 13 is the same as that of the memory system of FIG. 1. Further, ECC 13 and erase area detecting-circuit 16 are disposed in memory controller 11 in the embodiment, but they may be disposed in an area other than memory controller 11, such as nonvolatile semiconductor memory 12.

FIG. 4 shows the erase area detecting-circuit.

In this example, one example of disposing erase area detecting-circuit 16 in memory controller 11 will be described.

Read data are read from the nonvolatile semiconductor memory by a first unit (bit number). The first unit means a frame size unit, for example, and is varied depending on the type of nonvolatile semiconductor memory (e.g. multi-level cell (MLC), single-level cell (SLC), and the like).

Input register 21 latches the first unit data read from the nonvolatile semiconductor memory (e.g. NAND flash memory) by a second unit.

For example, the first unit data read from the nonvolatile semiconductor memory is transferred by the second unit from the nonvolatile semiconductor memory to the erase area detecting-circuit in the memory controller. Input register 21 sequentially latches the second unit data. In this case, when the transfer of the second unit data is executeed through one cycle, the entire first unit data are input to input register 21 through cycles ≥first unit or second unit).

Bit state-counter 22 counts the bit state of the data latched in input register 21. The bit state means a value of each of bits, i.e. "0" or "1". For example, bit state-counter 22 counts the number of "0" or "1" of the bits latched in input register 21.

Accumulation circuit 33 accumulates the values counted by bit state-counter 22 until the total number of the data input to input register 21 reaches to the first unit.

For example, adder 24 adds the values counted by bit state-counter 22 for n times (n is a positive integer, n>first unit or second unit). Accumulation register 23 latches an output from adder 24. As a result, a loop of accumulation register 23, adder 24, and selector 25 is repeated for n times, so that the count values of bit state-counter 22 are accumulated in accumulation register 23.

Frame size-setup register 26 latches the first unit (frame size unit) which is the unit by which the read data are read from the nonvolatile semiconductor memory. This operation is executeed before controller 11 gives a command for a read operation to the nonvolatile semiconductor memory. For example, since it is possible to recognize the frame size unit depending on whether or not the data to be accessed exist in a binary area or depending on whether or not the data to be accessed exist in a multivalue area, the frame size unit is latched in frame size-setup register 26.

Threshold value-register 27 latches a threshold value for detecting whether or not the erase area is accessed. For example, under the assumption that the erase state is "1", almost all of the data read from the nonvolatile semiconductor memory are "1" when the erase area is accessed.

Accordingly, when it is detected that the erase area is accessed and the number of "0" among the first units is less than x (x is a positive integer), for example, x is latched in threshold value setup register 27, and bit state-counter 22 counts the number of "0" (Example 1).

Further, when it is detected that the erase area is accessed and the number of "1" among the first units exceeds y (y is a positive integer), y is latched in threshold value setup register 27, and bit state-counter 22 counts the number of "1" (Example 2).

Input data-counter 28 counts the read data (input data) input from the nonvolatile semiconductor memory to input register 21 and instructs comparison circuit 29 to compare the accumulated value of the values counted by bit state-counter 22 with the threshold value of threshold value-register 27 when the number of counted read data reaches to the first unit.

In Example 1, comparison circuit 29 detects that the erase area is accessed when the accumulated value (number of "0") is less than x or detects that the used area is accessed when the accumulated value (number of "0") is equal to or more than x. The result is latched in product storage-register 30 by the first unit.

Further, in Example 2, comparison circuit 29 detects that the erase area is accessed when the accumulated value (number of "1") exceeds y or detects that the used area is accessed when the accumulated value (number of "1") is equal to or less than 7. The result is latched in product storage-register 30 by the first unit.

Input data-counter 28 temporarily switches selector 25 to reset accumulation register 23 when the number of read data (input data) input from the nonvolatile semiconductor memory to input register 21 reaches to the first unit.

In this example, the accumulated value of the values counted by bit state-counter 22 and the threshold value of threshold value-register 27 are compared with each other when the number of read data (input data) input from the nonvolatile semiconductor memory to input register 21 reaches to the first unit.

However, in Example 1, it may be detected that the used area is accessed immediately when the accumulation value (number of "0") reaches to x or more to store the result in product storage-register 30 (Example 3).

Likewise, in Example 2, it may be detected that the erase area is accessed immediately when the accumulation value (number of "1") exceeds y to store the result in product storage-register 30 (Example 4).

In Example 3 and Example 4, since it is possible to detect whether or not the erase area is accessed before the number of the read data (input date) input to input register 21 reaches to the first unit, it is possible to further improve the access executeance due to the latency improvement.

For example, in Example 4, since it is possible to detect that the erase area is accessed before the data reading from the nonvolatile semiconductor memory is finished, it is possible to discontinue the data reading from the erase area. More specifically, it is possible to detected that the erase area is accessed at the time point when the accumulated value (number of "1") exceeds y during the first unit read data are read from the nonvolatile semiconductor memory, and it is possible to omit the reading of the rest of the first unit read data from the nonvolatile semiconductor memory.

Further, it is possible to execute the processing of any one of Example 1 to Example 4 after inverting the read data by a data inversion circuit.

Meanwhile, it is necessary that the error correction processing by ECC 13 and the processing by erase area detecting-circuit 16 are linked with each other.

In ECC 13, the error correction processing is executed by the first unit which is the frame size unit. For example, when the frame size unit is changed, such as when the memory system uses both of the binary data and the multivalue data, memory controller 11 is provided with ECCs or provided with an ECC in which the error correction size is changeable.

The value of frame size-setup register 26 is set in accordance with the unit (first unit) of processing of ECC 13. Further, when a read error occurs, a position of the frame (first unit) in which the read error occurred is latched in error frame-register 31.

Controller 11 is capable of confirming whether or not the read error occurs in a predetermined frame by confirming the information of error frame-register 31 via control bus 32 in the read operation. Further, controller 11 is capable of detecting whether the read error in the predetermined frame is caused by an access to erase area or is a true read error (defective chip) immediately after the read error occurrence by taking the value of product storage-register 30 into consideration, thereby shifting to the next processing.

As described above, since ECC 13 and erase area detecting-circuit 16 are satisfactorily linked with each other, it is possible to realize the reliability improvement through read disturb suppression and the access executeance improvement through latency improvement.

Hereinafter, a processing to be executeed by the memory system when a read error occurs will be described.

Figure 5:
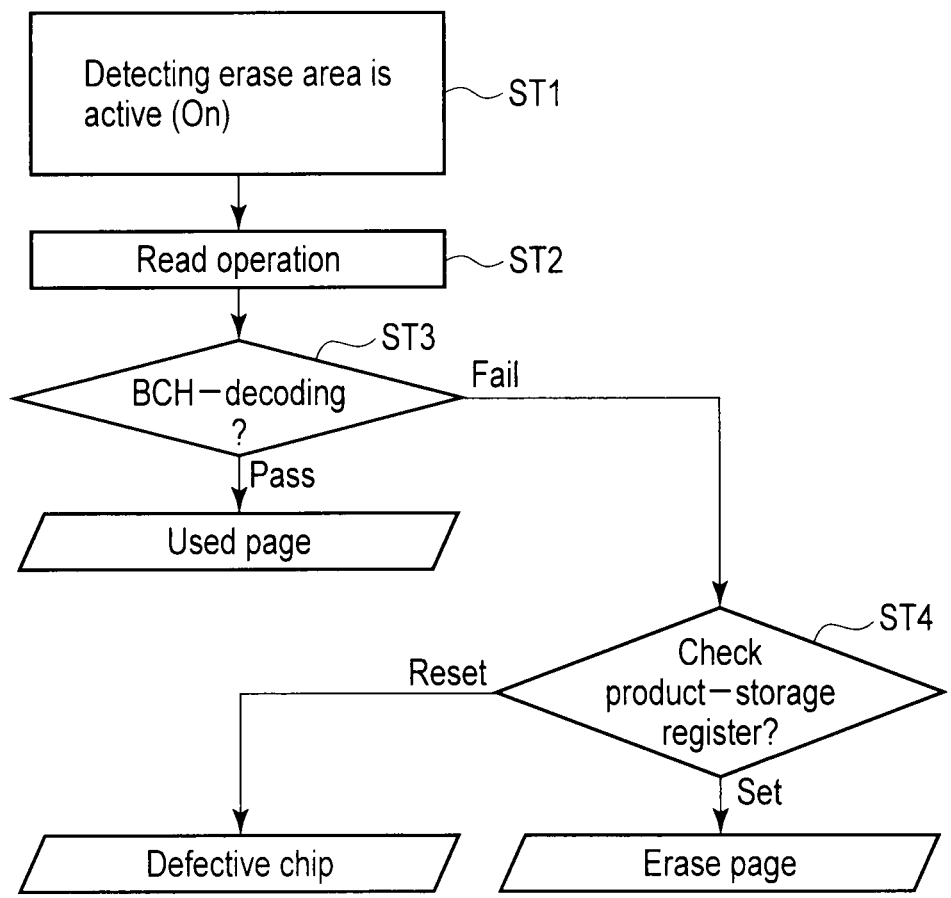
FIG. 5 is a flowchart showing an interruption processing when a read error occurs.

FIG. 5 shows a flowchart of a read operation.

The read operation is executed after predetermined register settings which are required for reading data from the nonvolatile semiconductor memory are input. Further, register settings which are required for detecting whether or not a processing (erase area detecting processing) for detecting whether or not the erase area is accessed when a read error occurs is executed are input (Steps ST1 to ST2).

When the erase area detecting processing is executeed, a unit (first unit) of read data (input data) which are read from a memory cell array (e.g. nonvolatile semiconductor memory) is set in the frame size-setup register. Further, a threshold value for detecting whether or not the erase area is accessed is set in the threshold value-register.

Here, the erase area detection is set to ON. Further, in this example, one example of executeing detection by the erase area detecting-circuit after inverting the read data from the nonvolatile semiconductor memory will be described. More specifically, in the example to be described, an erase state before the data inversion is "1"; the number of "0" in the first units after the data inversion is accumulated; and whether or not an accumulated value exceeds y is detected (corresponds to an example in which "1" in Example 2 is replaced by "0").

FIG. 6 shows one example of threshold value-register.

The threshold value to be used for detecting whether or not the erase area is accessed is set by the number of "0" existing in the first units. For example, under the assumption that the first unit is formed of 1024 ($2^{10}$) bits+redundant bits (including parity bit for ECC), the threshold value-register sets the threshold value by lower 11 bits (bit 0 to bit 10) among 32 bits (bit 0 to bit 31).

The threshold value is decided depending on the type, executeance, and the like of the nonvolatile semiconductor memory.

When the first unit is a variable value, the threshold value-register is required to have the number of bits which is sufficient for setting a threshold value for a maximum value of the first unit. For example, when the first unit selectively has one of 1024 ($2^{10}$) bits+redundant bits and 512 ($2^9$) bits+redundant bits, the threshold value register is required to have 11 bits (bit 0 to bit 10) which enables to set the maximum value of the first unit.

In this example, a bit symbol of the threshold value used for detecting whether or not the erase area is accessed is ERTHOV[10:0] in which reading of the threshold value is represented by Read (R), and writing of the threshold value is represented by Write (W). Further, the uppermost bit (bit 31) of the threshold value-register is used as an area for showing ON/OFF of the erase area detection. A bit symbol of the erase area detection is ERCNTE N, in which reading of the erase area is represented by Read (R), and writing of the erase area is represented by Write (W).

Further, in this example, each of the threshold value ERTHOV[10:0] and the erase area detection ERCNTE N indicates a reset state "0" before writing.

When an error correction of the first unit is allowed to pass in an error correction (e.g. BCH-decoding) by the ECC, it is detected that the first unit is in the used page. In contrast, when an error correction of the first unit fails in an error correction by the ECC (when a read error occurs), whether or not the first unit is in the erase page is detected.

The detection is immediately completed by taking the value of the product storage-register in the erase area detecting-circuit into consideration.

When the value of the product storage-register indicates that the first unit is in the erase page, it is detected that the first unit exists in the erase page. When the value of the product storage-register is different from the above one, it is detected that a true read error, i.e. a defective chip, occurred, and the processing proceeds to the following step (Step ST3).

Figure 7:
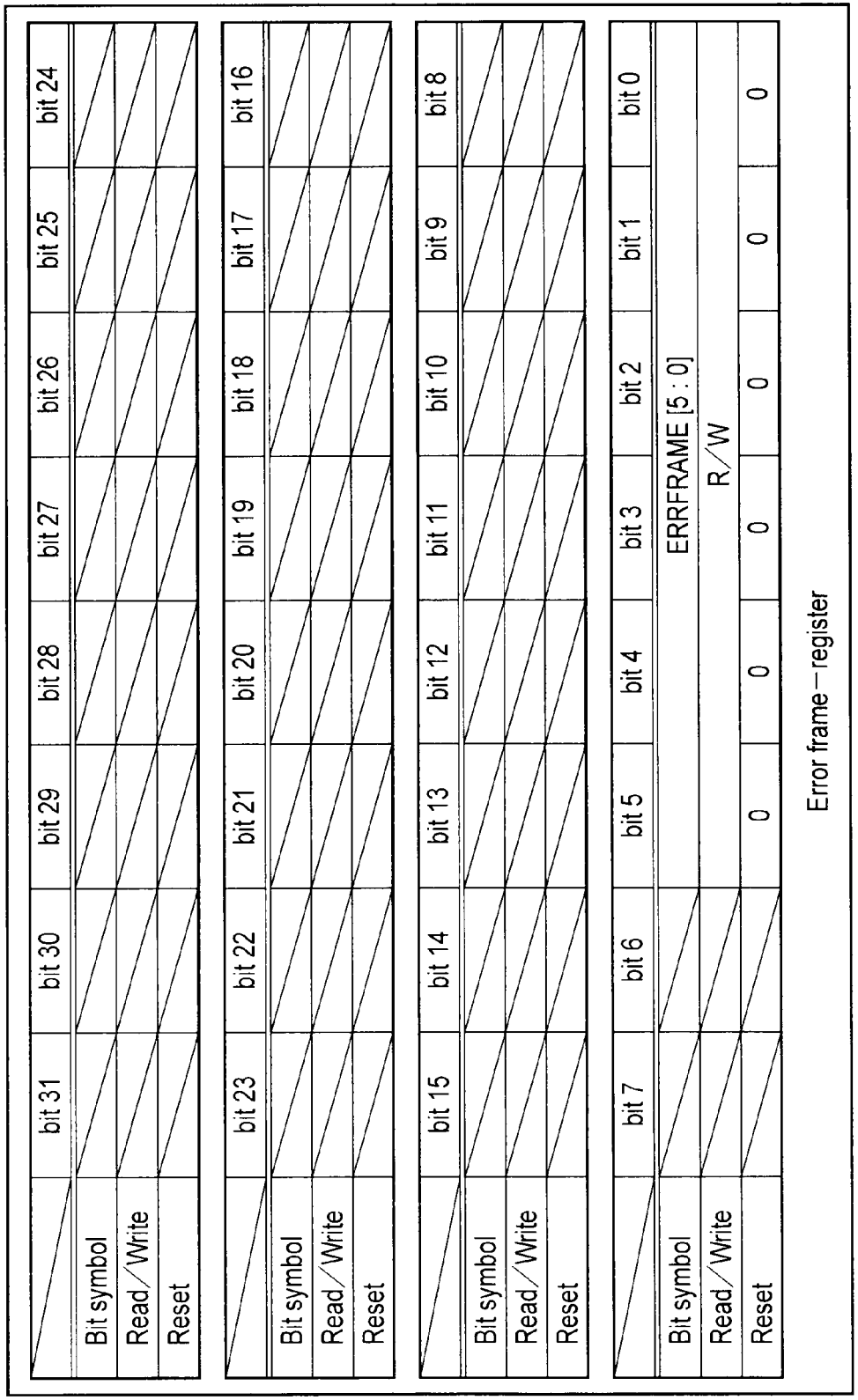
FIG. 7 is a diagram showing an error frame-register.

FIG. 7 shows one example of error frame-register. The error frame-register is required to have a bit number which is sufficient for defining the number of read data (e.g. corresponding to the number of frames per page) which are read from the memory cell array by the first unit. For example, when one page is formed of 64 kilobits, and one frame (first unit) is formed of one kilobit, the number of read data which are read from the memory cell array by the first unit is 64.

Accordingly, in this case, the error frame-register specifies a position of the frame (first unit) to be read from the memory cell array from lower 6 bits (bit 0 to bit 5) among 32 bits (bit 0 to bit 31) as shown in FIG. 7.

In this example, a bit symbol of the error frame-register is ERRFRAME[5:0], reading of the error frame-register is represented by Read (R), and writing of writing of the error frame-register is represented by Write (W). Further, in this example, the error frame-register ERRFRAME[5:0] indicates a reset state "0" before writing.

FIG. 8 and FIG. 9 show one example of the product storage-register.

The product storage-register corresponds to the error frame-register of FIG. 7. More specifically, the number of read data (frames) which are read from the memory cell array by the first unit is 64.

Accordingly, as shown in FIG. 8 and FIG. 9, the product storage-register has 64 bits (bit 0 to bit 31×2).

In this example, a bit symbol of the product storage-register is ERF[63:0], reading of the product storage-register is represented by Read (R), and writing of the product storage-register is represented by Write (W). Further, in this example, the product storage-register ERF[63:0] indicates a reset state "0" before writing.

As described above, when an error correction in a first unit in the ECC fails (when the read error occurs), it is possible to immediately detect whether or not the first unit is in the erase page by taking the value of the product storage-register in the erase area detecting-circuit into consideration.

Meanwhile, a read error invariably occurs when the erase page is accessed.

The reason for the read error occurrence is that because the data structure by the first unit (frame size unit) which is the unit of the error correction by the ECC inevitably contains the parity bit in addition to user data. Therefore, since the parity bit is in the erase state when the first unit is in the erase state, the error correction in the ECC invariably results in the read error due to the inappropriate parity bit.

As described above, since it is possible to immediately detect whether or not the first unit is in the erase page by taking the value of the product storage-register in the erase area detecting-circuit into consideration when the read error of the first unit occurs in the ECC, the retry operation is not required, and, as a result, high speed read error processing is attained. Therefore, the reliability improvement through read disturb suppression and the access executeance improvement through latency improvement are realized.

The erase area detecting processing of deciding the value of the product storage-register is executed in parallel to the read operation (Step ST2 to ST3).

For example, after the completion of inputting settings for the registers and upon start of the read operation, read data by the first unit (e.g. 1024 bits+redundant bits) are sequentially input into the input register by the second unit after the data inversion.

The number of "0" is calculated based on the second unit which is latched firstly in the input register, and the value is latched in the accumulation register. Likewise, the number of "0" is calculated based on the second unit which is latched secondly in the input register, and the value is added to the value of the accumulation register. The result is latched again in the accumulation register. The above-described operation is repeated until the total number of read data input to the input register reaches to the first unit.

Further, when the count value in the input data-counter reaches to the value (e.g. first unit) which is set in the frame size-setup register, the accumulation value of the accumulation circuit and the threshold value of the threshold value-register are compared with each other.

For example, when a read error occurs in No. 3 of the first units, the value of the error frame-register ERRFRAME[5:0] of FIG. 7 becomes the value ERRFRAME[5:0]=000011 which indicates the number (frame number) of the first unit No. 3.

In parallel to the above-described operation, since it is detected that the erase area is accessed when accumulation value>threshold value (y) in No. 3 (frame number) of the first units, the value of product storage-register ERF3 of FIG. 8 and FIG. 9 is set to "1". Further, since it is not detected that the erase area is accessed when accumulation value ≤threshold value (y) in No. 3 (frame number) of the first units, the value of product storage-register ERF3 of FIG. 8 and FIG. 9 is set to "0".

Upon confirmation of the read error which occurred in No. 3 of the first unit (frame number) based on ERRFRAME[5:0]=000011, the memory controller takes the value of ERF3 of the product storage-register into consideration to detect whether the read error in No. 3 of the first unit is caused by an access to the erase area or is a true read error.

The read data are sequentially input into the ECC as decoded data. A decode processing is executed by returning randomized data to original data before the read data is inputted in the ECC. A randomize processing means controlling a write state of predetermined data pattern by dispersing write data in a write operation of a NAND flash memory. The randomize processing is preferable to a high reliability. Therefore, A randomize processing becomes non-active before the read data is inputted in the ECC, and then, A decode processing is executed by inputting the read data in the ECC. A decode processing starts when the read data with a first unit (a frame size) is inputted in the ECC after the randomize processing becomes non-active. Further, in parallel to the above-described processing, the read data from the NAND flash memory are sequentially inputted to the erase area detecting-circuit. The detection of whether or not the erase area is accessed is started, when the read data with the first unit (frame size) is inputted in the erase area detecting-circuit.

Since the normal completion of the decode processing in the ECC means the absence of read error, the decode processing on the first unit is continued in the ECC. When a read error occurs due to a certain cause, the decode processing in the ECC is temporarily stopped, and the cause is confirmed by an interruption processing.

It is easy to detect whether or not the read error was caused by an access to the erase page by using the erase area detecting-circuit of the embodiment.

Figure 10:
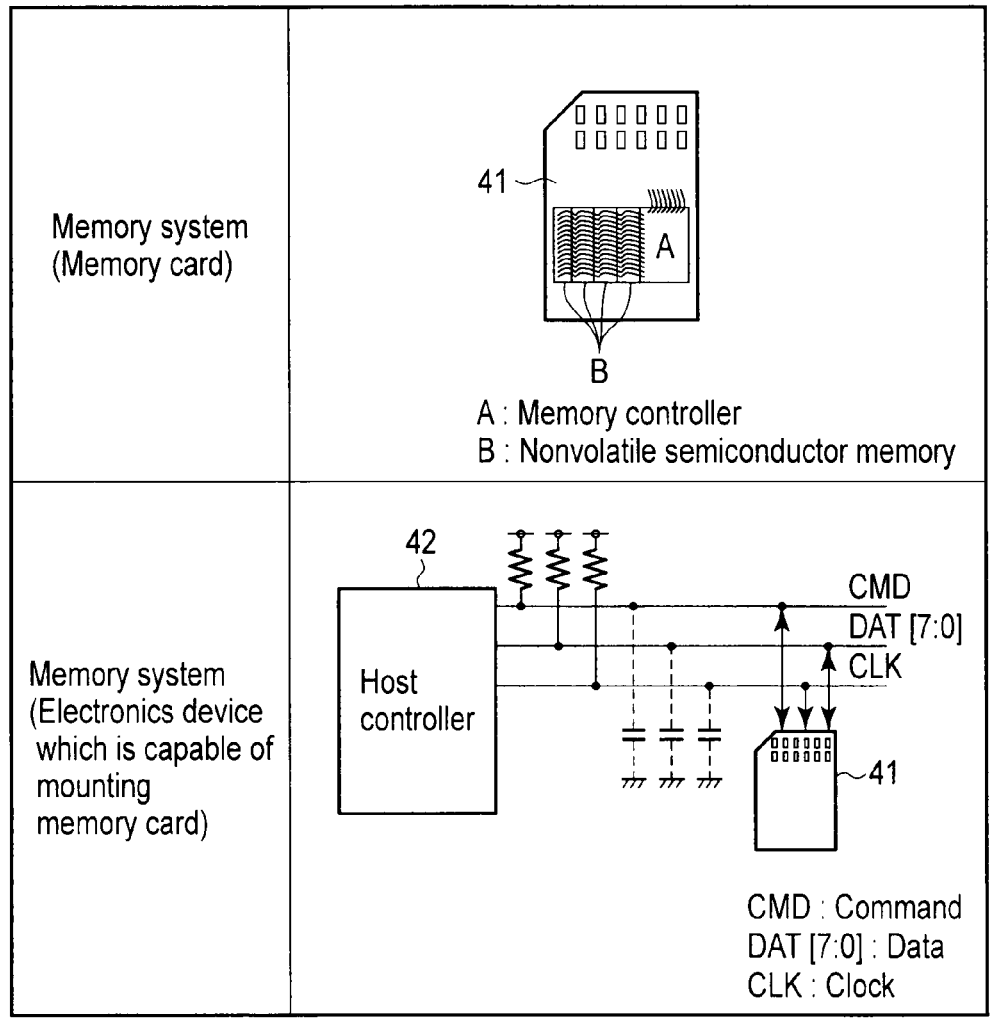
FIG. 10 is a diagram showing a memory system as one application example.

FIG. 10 shows a memory system as one application example.

In this example, a system using a memory card will be described, but the embodiment is applicable to other memory systems (solid state drive (SSD), USB memory, and the like). In FIG. 10, CMD is an abbreviation for command; DAT[7:0] means read/written data; and CLK is an abbreviation for clock.

Memory card 41 forms a memory system including memory controller A and nonvolatile semiconductor memory B. Further, an electronic device (e.g. digital video camera or the like) to which memory card 41 can be mounted forms a memory system including memory card 41 and host controller 42.

When a read command is sent from host controller 42 to memory card 41, data reading from nonvolatile semiconductor memory B is executed. When memory controller A has the erase area detecting-circuit of the embodiment, memory controller A recognizes information of the error frame-register by an interruption request or any other method (palling operation of the register) if a read error occurs.

Memory controller A confirms the frame in which the read error occurred and simultaneously detects the product storage-register in the erase area detecting-circuit. Memory controller A detects that the read error is caused by an access to the erase area when the value of the product storage-register corresponding to the frame in which the read error occurs is in a set state ("1"), and the processing proceeds to the next step.

As described above, according to the embodiment, the erase area detecting-circuit recognizes the bit state of the data read from the memory cell array by the frame size unit which is the error correction unit in the ECC and has the function of enabling to shift to the read error processing without executeing the retry operation when the read error occurs. With such configuration, the reliability improvement through read disturb suppression and the access executeance improvement through latency improvement are realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   an input register which latches, by a second unit, data which are read from a memory cell array by a first unit;
   a bit state-counter which counts a bit state of the data latched in the input register;
   a frame size-setup register which latches the first unit;
   an input data-counter which detects whether or not a total number of the data input to the input register reaches to the first unit;
   an accumulation circuit which accumulate a value counted by the bit state-counter;
   a threshold value-register which latches a threshold value for detecting whether or not an erase area of the memory cell array is accessed;

a comparison circuit which compares an accumulated value of the accumulation circuit and the threshold value with each other and detects whether or not the erase area is accessed; and
a product storage-register which latches a result of the comparison circuit.

2. The circuit of claim 1,
wherein the comparison circuit compares an accumulated value of the accumulation circuit and the threshold value with each other when the total number of the data input to the input register reaches to the first unit and detects whether or not the erase area is accessed.

3. The circuit of claim 1,
wherein the comparison circuit compares an accumulated value of the accumulation circuit and the threshold value with each other before the total number of the data input to the input register reaches to the first unit and detects whether or not the erase area is accessed.

4. The circuit of claim 1,
wherein the first unit is a variable value.

5. The circuit of claim 1, further comprising:
an ECC which executes an error correction processing by the first unit; and
an error frame-register which latches a read error in the ECC for each of the first units,
wherein the product storage-register latches the result indicating whether or not the erase area is accessed for each of the first units.

6. The circuit of claim 5,
wherein the product storage-register detects whether or not the read error in the first unit is caused by an access to the erase area when the error frame-register confirms the occurrence of the read error in the first unit.

7. The circuit of claim 1,
wherein the threshold value-register stores a number x of bits which is not in an erase state as the threshold value, and the comparison circuit detects that the erase area is accessed when the accumulation value is smaller than the number x.

8. The circuit of claim 1,
wherein the threshold value-register stores a number y of bits which is in the erase state as the threshold value, and the comparison circuit detects that the erase area is accessed when the accumulation value is larger than the number y.

9. The circuit of claim 1,
wherein the accumulation value of the accumulation circuit is reset when the total number of the data input to the input register reaches to the first unit.

10. A memory system comprising:
a nonvolatile semiconductor memory; and
a memory controller which outputs a command signal to the memory and inputs data from the memory,
wherein the memory controller comprises the circuit of claim 1.

11. A memory system comprising:
a nonvolatile semiconductor memory; and
a memory controller which controls the memory and comprises the circuit of claim 1 and a ECC, the circuit further comprising a randomize active/non-active circuit,
wherein the memory controller is configured to:
latch randomized data in the input register by the second unit after reading the randomized data from the memory cell array by the first unit; and
execute an error correction processing and an erase area detecting in parallel to the randomized data latched in the input register,
wherein the error correction processing comprising:
returning the randomized data to original data by the randomize active/non-active circuit; and
executing an error correction by the first unit to the original data returning from the randomized data,
the erase area detecting comprising:
counting a bit state of the randomized data latched in the input register by the bit state-counter; and
detecting whether or not the erase area is accessed based on a value counted by the bit state-counter.

12. The system of claim 11,
the erase area detecting further comprising:
latching the first unit by the frame size-setup register;
detecting whether or not a total number of the randomized data input to the input register reaches to the first unit by the input data-counter;
accumulating a value counted by the bit state-counter in the accumulation circuit;
latching a threshold value for detecting whether or not an erase area of the memory cell array is accessed in the threshold value-register;
comparing an accumulated value of the accumulation circuit and the threshold value with each other and detecting whether or not the erase area is accessed by the comparison circuit; and
latching a result of the comparison circuit in the product storage-register.

13. The system of claim 12,
wherein the comparison circuit compares an accumulated value of the accumulation circuit and the threshold value with each other when the total number of the randomized data input to the input register reaches to the first unit and detects whether or not the erase area is accessed.

14. The system of claim 12,
wherein the comparison circuit compares an accumulated value of the accumulation circuit and the threshold value with each other before the total number of the randomized data input to the input register reaches to the first unit and detects whether or not the erase area is accessed.

15. The system of claim 12,
wherein the memory controller is configured to:
latch a read error in the ECC for each of the first units in an error frame-register; and
latch the result indicating whether or not the erase area is accessed for each of the first units in the product storage-register.

16. The system of claim 15,
wherein the product storage-register detects whether or not the read error in the first unit is caused by an access to the erase area when the error frame-register confirms the occurrence of the read error in the first unit.

17. The system of claim 12,
wherein the threshold value-register stores a number x of bits which is not in an erase state as the threshold value, and the comparison circuit detects that the erase area is accessed when the accumulation value is smaller than the number x.

18. The system of claim 12,
wherein the threshold value-register stores a number y of bits which is in the erase state as the threshold value, and the comparison circuit detects that the erase area is accessed when the accumulation value is larger than the number y.

19. The system of claim 12,
wherein the accumulation value of the accumulation circuit is reset when the total number of the randomized data input to the input register reaches to the first unit.

20. The system of claim 12,
wherein the original data are converted the randomized data by the randomize active/non-active circuit after processing by the ECC; and
the randomized data from the randomize active/non-active circuit is written in the memory cell array.

* * * * *